United States Patent
Lee et al.

(10) Patent No.: US 6,954,892 B2
(45) Date of Patent: Oct. 11, 2005

(54) METHOD FOR CALCULATING SYNDROME POLYNOMIAL IN DECODING ERROR CORRECTION CODES

(75) Inventors: Chen-Yi Lee, Hsinchu (TW); Hsie-Chia Chang, Keelung (TW); Chien-Ching Lin, Chiai (TW)

(73) Assignee: National Chiao Tung University, Hsinchu (TW)

( * ) Notice: Subject to any disclaimer, the term of this patent is extended or adjusted under 35 U.S.C. 154(b) by 431 days.

(21) Appl. No.: 10/162,911

(22) Filed: Jun. 6, 2002

(65) Prior Publication Data

US 2003/0229842 A1 Dec. 11, 2003

(51) Int. Cl.[7] .............................................. H03M 13/00
(52) U.S. Cl. ....................................... 714/784; 714/782
(58) Field of Search ................................ 714/781, 782, 714/784, 746, 756, 793, 764, 752

(56) References Cited

U.S. PATENT DOCUMENTS

| | | | | |
|---|---|---|---|---|
| 4,142,174 A | * | 2/1979 | Chen et al. ................. | 714/784 |
| 5,901,158 A | * | 5/1999 | Weng et al. ................. | 714/785 |
| 5,974,583 A | * | 10/1999 | Joo ............................. | 714/784 |
| 6,119,262 A | * | 9/2000 | Chang et al. ............... | 714/781 |
| 6,122,766 A | * | 9/2000 | Fukuoka et al. ............ | 714/784 |
| 6,360,348 B1 | * | 3/2002 | Yang .......................... | 714/784 |
| 2003/0145272 A1 | * | 7/2003 | Fukuoka et al. ............ | 714/784 |

* cited by examiner

*Primary Examiner*—Guy Lamarre
*Assistant Examiner*—John P. Trimmings
(74) *Attorney, Agent, or Firm*—Rosenberg, Klein & Lee

(57) ABSTRACT

The present invention provides a method of calculating the syndrome polynomial in decoding error correction codes. From the relation between the syndromes and the coefficients of the error locator polynomial, the inference that the first t syndromes are zeros, then the next t syndromes are also zeros can be deduced, wherein t is the largest number of correctable errors. For all received codewords, the first t syndromes are calculated. Next, whether the first t syndromes are zeros is judged. If the first t syndromes are zeros, the computation is stopped; otherwise, the next t syndromes are calculated. Therefore, the present invention can judge whether the received codeword is erroneous with only a half of computation, hence effectively reducing the computation in practical operation and achieving the object of low power consumption.

12 Claims, 2 Drawing Sheets

METHOD FOR CALCULATING SYNDROME POLYNOMIAL IN DECODING ERROR CORRECTION CODES

FIELD OF THE INVENTION

The present invention relates to a method for calculating the syndrome polynomial and, more particularly, to a method for calculating the syndrome polynomial in decoding received errors-only or error-and-erasure codewords processed by error correction codes.

BACKGROUND OF THE INVENTION

In the transmission of data from a source location to a destination location through a variety of media, noise caused by the transmission path and/or the media itself causes errors in the transmitted data. Thus, error correcting coding techniques to enhance the reliability and efficiency of a digital communication system has become widespread. Among the most well-known error correcting codes, the BCH (Bose-Chaudhuri-Hocquenghen) codes and the RS (Reed-Solomon) codes are the most widely used block codes in the communication field such like Cable Modems, Digital Video Broadcasting (DVB) systems, optical fiber submarine cable systems, AMPS cellular phone storage systems such like the Digital Versatile Disks (DVDs), CD-ROMs, or the flash memory.

The decoding process of the conventional errors-only RS codes is shown in FIG. 1. A syndrome calculator 10 generates 2t syndromes after receiving a codeword polynomial R(x), wherein t is the largest number of correctable errors. From these syndromes ($S_1$~$S_{2t}$), a key equation solver 12 can generate an error locator polynomial σ(x) and an error evaluator polynomial Ω(x). Next, a Chien searcher 14 and an error evaluator 16 are used to determine the locations and values of errors, respectively. When both errors and erasures are corrected, σ(x) and Ω(x) are the errata locator polynomial and the errata evaluator polynomial, where the errata is referring to either an error or an erasure.

Generally speaking, the syndrome calculator can be used as an error detector. In the situation that the number of errors does not exceeds the largest number of correctable errors t, when all the calculated syndromes ($S_1$~$S_{2t}$) are zeros, there is no error in the received codeword. However, no matter whether the received codeword is erroneous, it is necessary to calculate these 2t syndromes in the conventional architecture. In other words, it is necessary to first calculate the entire syndrome polynomial composed of 2t syndromes to judge whether the received codeword is erroneous. In a practical transmission circuit, the probability of no error is much larger than that of error. Therefore, in the situation of no error, needless power consumption is wasted in calculating the whole syndrome polynomial.

Accordingly, the present invention aims to propose a method for calculating the syndrome polynomial in decoding error correction codes, whereby only a half of the original computation is required in the situation of no error, which is much frequently in the practical transmission, hence the drawbacks of higher computation and high power consumption in the prior art can be overcome.

SUMMARY OF THE INVENTION

The primary object of the present invention is to propose a method of calculating the syndrome polynomial in decoding error correction codes, which can effectively reduce the computation of circuit in practical operation to achieve the object of lower power consumption.

Another object of the present invention is to propose a method of calculating the syndrome polynomial in decoding error correction codes, which can have the functions of error detection and correction at the same time of reducing the power consumption, hence ensuring the correctness of data.

To achieve the above objects, the method of the present invention first utilizes the received errors-only or error-and-erasure codewords processed by error correction codes to calculate the first t syndromes, wherein t is the largest number of correctable errors. Next, whether the first t syndromes are zeros is judged. If the first t syndromes are zeros, the computation is stopped; otherwise, the next t syndromes are calculated.

The various objects and advantages of the present invention will be more readily understood from the following detailed description when read in conjunction with the appended drawings, in which:

DETAILED DESCRIPTION OF THE PREFERRED EMBODIMENTS

The RS code is one of widely adopted error correction codes in digital communications and data storage systems. It has a very high detection and correction capacity for multiple errors. If the received codeword contains no errors, it can be shown that all syndromes ($S_1$~$S_{2t}$) will all equal zeros. In the conventional design, it is necessary to calculate 2t syndromes no matter whether the received codeword is erroneous. However, from the relation between the syndromes and the coefficients of the error locator polynomial, if the first t syndromes $S_1$~$S_t$ are zeros, the next t syndromes $S_{t+1}$~$S_{2t}$ are also zeros. Therefore, in judging whether the received codeword is erroneous, it is only necessary to calculate the first t syndromes.

Figure 2:
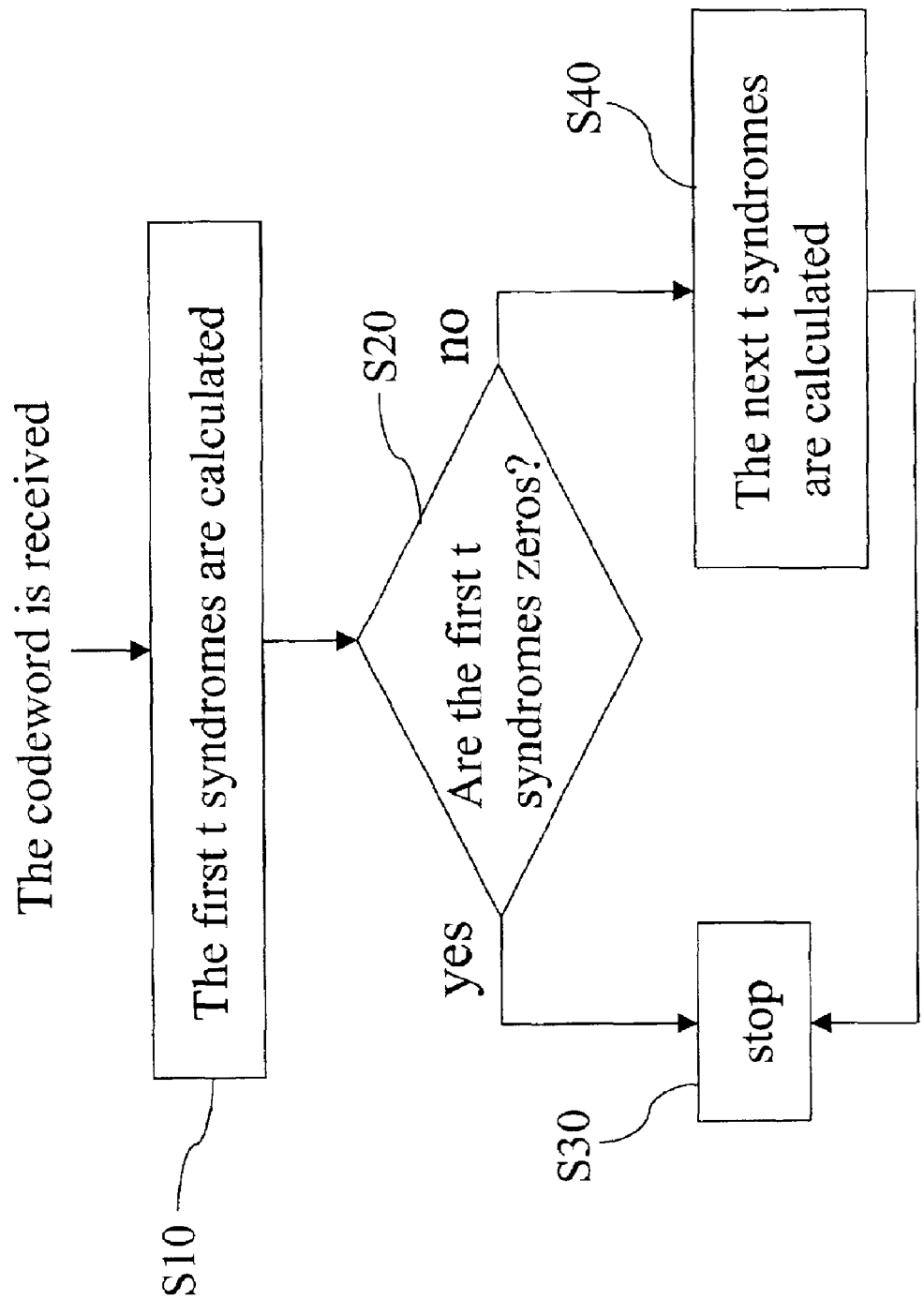
FIG. 2 is a flowchart of the present invention.

FIG. 2 shows a method of calculating the syndrome polynomial in decoding the received codeword processed by error correction codes in the present invention. The method comprises the following steps. First, a syndrome calculator is used to calculate the first t syndromes $S_1$~$S_t$ for all received codewords processed by error correction codes, wherein t is the number of correctable errors, as shown in Step S10. Next, as shown in Step S20, whether the first t syndromes are zeros is judged. If the first t syndromes ($S_1$~$S_1$) are zeros, the next t syndromes ($S_{t+1}$~$S_{2t}$) are also zeros, so the computation is stopped, as shown in Step S30. If one of the first t syndromes does not equal zero, the next t syndromes are calculated, as shown in Step S40.

Figure 1:
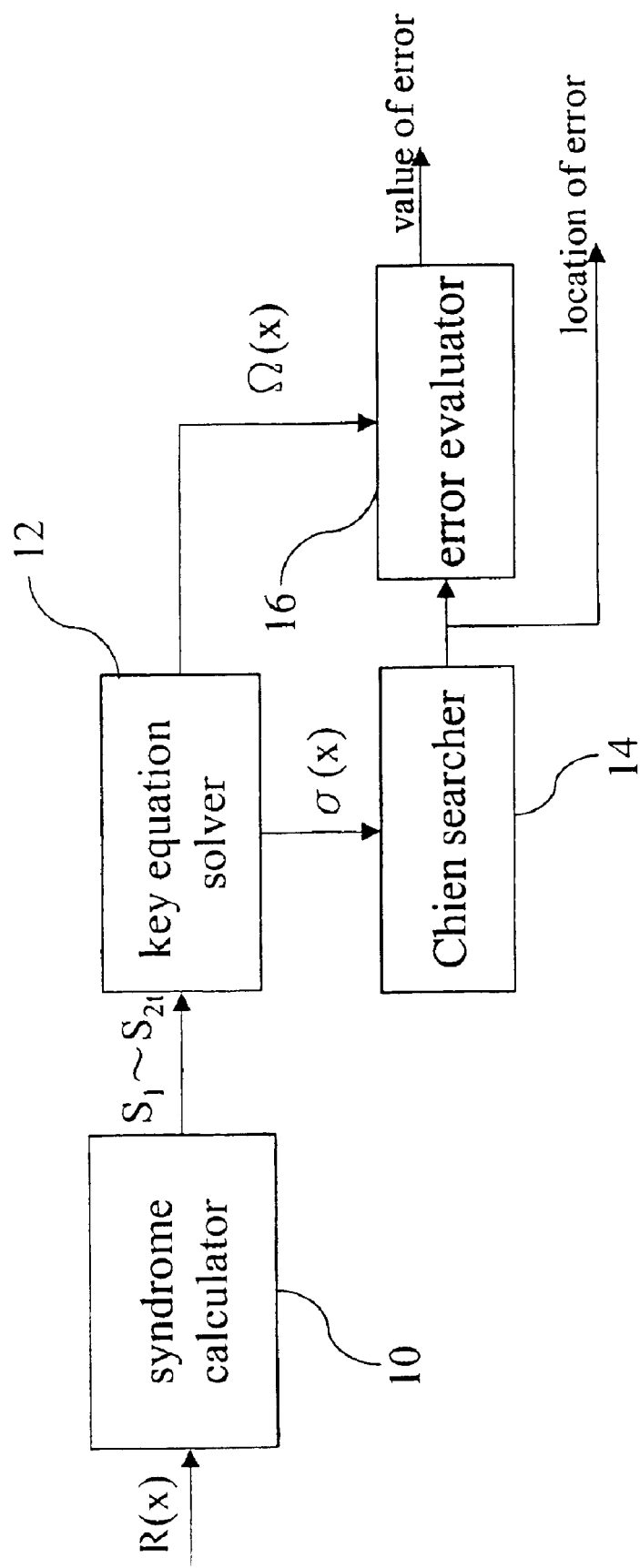
FIG. 1 shows the decoding process of the conventional RS codes.

When the calculated syndromes $S_1$~$S_t$ are zeros, it can be deduced that the next t syndromes are also zeros. Contrarily, when all the calculated syndromes $S_1$~$S_{2t}$ are not zeros, the received codeword is erroneous, and it is necessary to find out the positions and values of errors. At this time, the syndromes can be exploited to calculate the locations and values of errors. Please refer to FIG. 1, from the calculated syndromes ($S_1$~$S_{2t}$), the key equation solver 12 can be used to calculate the error locator polynomial σ(x) and the error evaluator polynomial Ω(x). Next, the Chien searcher 14 is used to determine the locations of errors by finding the roots of the error locator polynomial σ(x), and the error evaluator 16 is used to calculate the values of errors from the error evaluator polynomial Ω(x).

In addition to calculating the received errors-only codewords processed by error correction codes to obtain the syndromes, the present invention can also perform calculation to the received codewords in error-and-erasure cases. Moreover, from the relation between the syndromes and the coefficients of the error and erasion locator polynomial, the present invention can deduce that if the first syndromes $S_1$~$S_t$ are zeros, the next t syndromes $S_{t+1}$~$S_{2t}$ are also zeros. Therefore, it is only necessary to calculate the first syndromes to judge whether the received codeword is erroneous. Except that the errata locator polynomial and errata evaluator polynomial are used to determine the locations and values of errata, this way of calculation for the received error-and erasure codeword processed by error correction codes is the same as the above way and thus will not be further described.

The inference that the first t syndromes are zeros, then the next t syndromes are also zeros is deduced from the relation between the syndromes ($S_1$~$S_{2t}$) and the coefficients ($\sigma_1$~$\sigma_t$) of the error locator polynomial. The relation between the syndromes ($S_1$~$S_{2t}$) and the coefficients ($\sigma_1$~$\sigma_t$) of the error locator polynomial is as follows:

$$\begin{bmatrix} S_1 & S_2 & S_3 & \cdots & S_t \\ S_2 & S_3 & S_4 & \cdots & S_{t+1} \\ S_3 & S_4 & S_5 & \cdots & S_{t+2} \\ \vdots & \vdots & \vdots & & \vdots \\ S_t & S_{t+1} & S_{t+2} & \cdots & S_{2t} \end{bmatrix} \begin{bmatrix} \sigma_t \\ \sigma_{t-1} \\ \sigma_{t-2} \\ \vdots \\ \sigma_1 \end{bmatrix} = \begin{bmatrix} -S_{t+1} \\ -S_{t+2} \\ -S_{t+3} \\ \vdots \\ -S_{2t} \end{bmatrix}$$

It should be noted that the above equation only holds when the practical number of errors $\upsilon$ is smaller than or equal to the largest number of correctable errors t ($\upsilon \leq t$). In the application of the Reed-Solomon decoder, the present invention is only concerned with the situations of $\upsilon \leq t$, i.e., the error correction actions performed when the number of errors is smaller than the largest number of correctable errors. In other words, according to the above equation, a half of the syndromes are first calculated in the present invention. When the first t syndromes ($S_1$~$S_t$) are zeros, it is not necessary to perform subsequent calculation no matter whether the value of $\upsilon$ is larger than the value of t. This is because when $\upsilon=0$, if the first t syndromes ($S_1$~$S_t$) all equal zero, the next t syndromes ($S_{t+1}$~$S_{2t}$) are also zeros. In this situation, it is not necessary to perform any error correction action. When $\upsilon>t$, any error correction action may change the original correct data, so it is also not necessary to perform any error correction action.

From the relation between syndromes and coefficients of the error locator polynomial, if the first t syndromes ($S_1$~$S_t$) are zeros, the next t syndromes ($S_{t+1}$~$S_{2t}$) are also zeros. This means that only the first t syndromes are required for judging whether the received codeword is erroneous. In a practical circuit, the probability of no error is much larger than that of error, the proposed method can thus effectively reduce the computation in practical operation of circuit, hence achieving the object of low power consumption.

Moreover, in most applications, the average power consumption depends on the situation of no error. Under the situation of no error, it is only necessary to operate the syndrome calculator. The method of judging whether there is error with only a half of computation in the present invention can effectively reduce the power consumption of the BCH decoder or the Reed-Solomon decoder. Therefore, the present invention has the error detection and correction capacity at the same time of reducing the power consumption, hence ensuring the correctness of data.

Although the present invention has been described with reference to the preferred embodiments thereof, it will be understood that the invention is not limited to the details thereof. Various substitutions and modifications have been suggested in the foregoing description, and other will occur to those of ordinary skill in the art. Therefore, all such substitutions and modifications are intended to be embraced within the scope of the invention as defined in the appended claims.

What is claimed is:

1. A method of calculating the syndrome polynomial in decoding received codewords processed by error correction codes, comprising the steps of:
   using all said received codewords processed by error correction codes to calculate the first t syndromes, wherein t is the number of correctable errors;
   judging whether said first t syndromes are zeros, determination of whether said first t syndromes are all zero being made simultaneously for all t, stopping the computation if said first t syndromes are zeros;
   continually calculating the next t syndromes if said first t syndromes are not all zero.

2. The method of calculating the syndrome polynomial as claimed in claim 1, wherein said received codewords are the Reed-Solomon codes or BCH (Base-Chaudhuri-Hocquenghem) codes.

3. The method of calculating the syndrome polynomial as claimed in claim 1, wherein when said first t syndromes are zeros, meaning said next t syndromes are also zeros, the computation is stopped because there is no error in said received codewords.

4. The method of calculating the syndrome polynomial as claimed in claim 3, wherein the inference that said first t syndromes are zeros, then said next t syndromes are also zeros is deduced from the relation between said 2t syndromes ($S_1$~$S_{2t}$) and coefficients ($\sigma_1$~$\sigma_t$) of an error locator polynomial.

5. The method of calculating the syndrome polynomial as claimed in claim 4, wherein said relation between said 2t syndromes ($S_1$~$S_{2t}$) and said coefficients ($\sigma_1$~$\sigma_t$) of said error locator polynomial is $$\begin{bmatrix} S_1 & S_2 & S_3 & \cdots & S_t \\ S_2 & S_3 & S_4 & \cdots & S_{t+1} \\ S_3 & S_4 & S_5 & \cdots & S_{t+2} \\ \vdots & \vdots & \vdots & & \vdots \\ S_t & S_{t+1} & S_{t+2} & \cdots & S_{2t} \end{bmatrix} \begin{bmatrix} \sigma_t \\ \sigma_{t-1} \\ \sigma_{t-2} \\ \vdots \\ \sigma_1 \end{bmatrix} = \begin{bmatrix} -S_{t+1} \\ -S_{t+2} \\ -S_{t+3} \\ \vdots \\ -S_{2t} \end{bmatrix}.$$

6. The method of calculating the syndrome polynomial as claimed in claim 5, wherein said relation only holds when the practical number of errors, $\upsilon$, is smaller than or equal to said largest number of correctable errors, t.

7. A method of calculating the syndrome polynomial in decoding received error-and-erasure codewords, comprising the steps of:
   using all said received error-and-erasure codewords processed by error correction codes to calculate the first t syndromes, wherein t is the number of correctable errors;
   judging whether said first t syndromes are zeros, determination of whether said first t syndromes are all zero being made simultaneously for all t, stopping the computation if said first t syndromes are zeros;
   continually calculating the next t syndromes if said first t syndromes are not all zero.

8. The method of calculating the syndrome polynomial as claimed in claim 7, wherein said received codewords are the Reed-Solomon codes.

9. The method of calculating the syndrome polynomial as claimed in claim 7, wherein when said first t syndromes are zeros, meaning said next t syndromes are also zeros, the computation is stopped because there is no error in said received codewords.

10. The method of calculating the syndrome polynomial as claimed in claim 9, wherein the inference that said first t syndromes are zeros, then said next t syndromes are also zeros is deduced from the relation between said 2t syndromes ($S_1$~$S_{2t}$) and coefficients ($\sigma_1$~$\sigma_t$) of an error locator polynomial.

11. The method of calculating the syndrome polynomial as claimed in claim 10, wherein said relation between said 2t syndromes ($S_1$~$S_{2t}$) and said coefficients ($\sigma_1$~$\sigma_t$) of said error locator polynomial is $$\begin{bmatrix} S_1 & S_2 & S_3 & \cdots & S_t \\ S_2 & S_3 & S_4 & \cdots & S_{t+1} \\ S_3 & S_4 & S_5 & \cdots & S_{t+2} \\ \vdots & \vdots & \vdots & & \vdots \\ S_t & S_{t+1} & S_{t+2} & \cdots & S_{2t} \end{bmatrix} \begin{bmatrix} \sigma_t \\ \sigma_{t-1} \\ \sigma_{t-2} \\ \vdots \\ \sigma_1 \end{bmatrix} = \begin{bmatrix} -S_{t+1} \\ -S_{t+2} \\ -S_{t+3} \\ \vdots \\ -S_{2t} \end{bmatrix}.$$

12. The method of calculating the syndrome polynomial as claimed in claim 11, wherein said relation only holds when the practical number of errors, $\upsilon$, is smaller than or equal to said largest number of correctable errors, t.

\* \* \* \* \*